US009425219B2

(12) United States Patent
Shi et al.

(10) Patent No.: US 9,425,219 B2
(45) Date of Patent: Aug. 23, 2016

(54) ARRAY SUBSTRATE WITH DATA LINE SHARING, MANUFACTURING METHOD THEREOF AND DISPLAY PANEL (71) Applicant: BOE TECHNOLOGY GROUP CO., LTD., Beijing (CN)

(72) Inventors: Ling Shi, Beijing (CN); Shiming Shi, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/355,445

(22) PCT Filed: May 20, 2013

(86) PCT No.: PCT/CN2013/075930
§ 371 (c)(1),
(2) Date: Apr. 30, 2014

(87) PCT Pub. No.: WO2014/146344
PCT Pub. Date: Sep. 25, 2014

(65) Prior Publication Data
US 2015/0236043 A1    Aug. 20, 2015

(30) Foreign Application Priority Data
Mar. 22, 2013 (CN) .......................... 2013 1 0095188

(51) Int. Cl.
*H01L 21/70* (2006.01)
*H01L 27/12* (2006.01)
(52) U.S. Cl.
CPC ......... *H01L 27/124* (2013.01); *H01L 27/1259* (2013.01)
(58) Field of Classification Search
CPC ....................................................... H01L 27/12

USPC ........................................... 438/158; 257/390
See application file for complete search history.

(56) References Cited

U.S. PATENT DOCUMENTS

| 7,567,228 B1 | 7/2009 | Wen et al. |
| 2004/0070713 A1* | 4/2004 | Song ................. G02F 1/133707 349/129 |

(Continued)

FOREIGN PATENT DOCUMENTS

| CN | 101644842 A | 2/2010 |
| CN | 101685228 A | 3/2010 |

(Continued)

OTHER PUBLICATIONS

International Search Report mailed Dec. 26, 2013; PCT/CN2013/075930.

(Continued)

*Primary Examiner* — Caleb Henry
(74) *Attorney, Agent, or Firm* — Ladas & Parry LLP (57) ABSTRACT

An array substrate, a manufacturing method thereof and a display panel are provided. The array substrate includes: a substrate; and first pixel groups and second pixel groups which are disposed on the substrate and are alternately arranged to form a pixel array. Each first pixel group includes two first pixel units, each first pixel unit includes a first pixel electrode connected with a common electrode and a second pixel electrode connected with a drain electrode of a drive TFT of the first pixel unit. Each second pixel group includes two second pixel units, each second pixel unit includes a third pixel electrode connected with a drain electrode of a drive TFT of the second pixel unit and a fourth pixel electrode connected with the common electrode.

14 Claims, 4 Drawing Sheets

(56) References Cited

U.S. PATENT DOCUMENTS

| | | | | |
|---|---|---|---|---|
| 2006/0192906 A1* | 8/2006 | Ryu | G02F 1/133345 | 349/43 |
| 2008/0303768 A1* | 12/2008 | Do | G09G 3/3659 | 345/90 |
| 2009/0310047 A1* | 12/2009 | Shin | G09G 3/3659 | 349/37 |
| 2010/0073337 A1* | 3/2010 | Tsubata | G02F 1/133707 | 345/204 |
| 2010/0073617 A1 | 3/2010 | Han | | |
| 2010/0103357 A1* | 4/2010 | Kye | G02F 1/133711 | 349/123 |
| 2011/0063538 A1* | 3/2011 | Xie | G02F 1/134309 | 349/43 |
| 2011/0102309 A1* | 5/2011 | Cho | G09G 3/3648 | 345/92 |
| 2011/0304787 A1* | 12/2011 | Wang | G02F 1/134309 | 349/33 |
| 2012/0161140 A1* | 6/2012 | Xue | G02F 1/136286 | 257/59 |
| 2012/0280236 A1* | 11/2012 | Kim | G02F 1/1362 | 257/59 |
| 2012/0286295 A1* | 11/2012 | Han | H01L 27/3227 | 257/81 |
| 2013/0077002 A1* | 3/2013 | Yoon | G02F 1/13624 | 349/38 |
| 2013/0128168 A1* | 5/2013 | Kim | G02F 1/133707 | 349/42 |
| 2013/0155358 A1* | 6/2013 | Kim | G02F 1/134363 | 349/110 |
| 2013/0208222 A1* | 8/2013 | Song | C07D 333/16 | 349/123 |
| 2013/0235019 A1* | 9/2013 | Kim | G09G 5/14 | 345/212 |
| 2013/0242367 A1* | 9/2013 | Cho | G02B 26/005 | 359/228 |
| 2013/0320314 A1* | 12/2013 | Kim | H01L 51/52 | 257/40 |
| 2013/0321492 A1* | 12/2013 | Tanaka | G09G 3/3655 | 345/690 |
| 2013/0321721 A1* | 12/2013 | Jin | G02B 27/22 | 349/15 |
| 2014/0054624 A1* | 2/2014 | Chen | G09G 3/32 | 257/89 |
| 2014/0055503 A1* | 2/2014 | Jung | G09G 5/10 | 345/690 |
| 2014/0070177 A1* | 3/2014 | Kim | H01L 27/3223 | 257/40 |
| 2014/0070221 A1* | 3/2014 | Li | H01L 29/78669 | 257/59 |
| 2014/0104523 A1* | 4/2014 | Jung | G02F 1/1343 | 349/41 |
| 2014/0104532 A1* | 4/2014 | Cho | G02F 1/133377 | 349/46 |
| 2014/0117385 A1* | 5/2014 | Park | H01L 27/124 | 257/88 |
| 2014/0131718 A1* | 5/2014 | Xue | H01L 27/124 | 257/71 |
| 2014/0146261 A1* | 5/2014 | Wu | G02F 1/134309 | 349/43 |
| 2014/0151651 A1* | 6/2014 | Jin | H01L 51/5209 | 257/40 |
| 2014/0175467 A1* | 6/2014 | Choi | G02F 1/134363 | 257/89 |
| 2014/0184559 A1* | 7/2014 | Han | G06F 3/0412 | 345/174 |
| 2014/0209932 A1* | 7/2014 | Huang | H01L 27/124 | 257/88 |
| 2014/0211106 A1* | 7/2014 | Shi | G06F 3/0412 | 349/12 |
| 2014/0368480 A1* | 12/2014 | Zhang | G09G 3/3648 | 345/205 |
| 2015/0015468 A1* | 1/2015 | Ko | G09G 3/3216 | 345/82 |
| 2015/0177579 A1* | 6/2015 | Lim | G02F 1/134336 | 345/90 |
| 2015/0214286 A1* | 7/2015 | Niu | H01L 27/3276 | 257/72 |

FOREIGN PATENT DOCUMENTS

| | | |
|---|---|---|
| CN | 102629056 A | 8/2012 |
| CN | 203117621 U | 8/2013 |

OTHER PUBLICATIONS

First Chinese Office Action dated Jan. 13, 2015; Appln. No. 201310095188.8.
International Preliminary report on Patentability Appln. No. PCT/CN2013/075930; Dated Sep. 22, 2015.

* cited by examiner

FIG. 1

| + | − | − | + |
|---|---|---|---|
| + | − | − | + |

ARRAY SUBSTRATE WITH DATA LINE SHARING, MANUFACTURING METHOD THEREOF AND DISPLAY PANEL

TECHNICAL FIELD

Embodiments of the disclosure relate to an array substrate, a manufacturing method thereof and a display panel.

BACKGROUND

Liquid crystal display (LCD) device is a flat-panel display device in which the arrangement of liquid crystal molecules is controlled by an electric field formed between a pixel electrode and a common electrode so that images are displayed by the control of the optical refraction index of the liquid crystal molecules. The LCD device comprises an array substrate and a color filter substrate. The array substrate comprises horizontally-arranged gate lines and vertically-arranged data lines. In the LCD device of advanced super dimension switch (ADS) mode, both of the pixel electrode and the common electrode are formed on the array substrate.

In the array substrate, the number of the gate line is generally equal to the number of the data line and each pixel is connected with the corresponding gate line and the corresponding data line.

Figure 1:
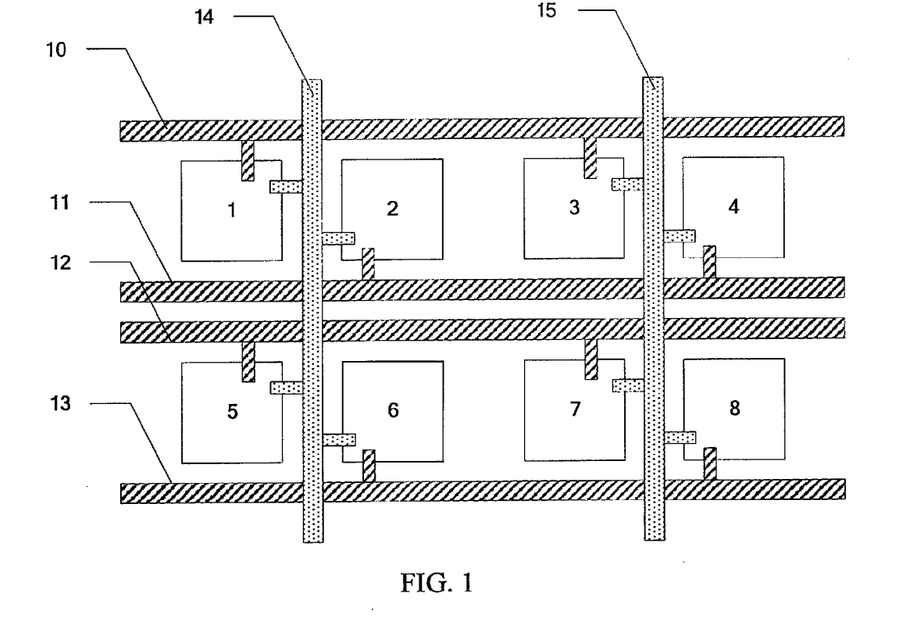
FIG. 1 is a schematic structural view illustrating an array substrate according to one technique.

According to one data line sharing (DLS) technology, the number of the data line is reduced by half. For instance, as illustrated in FIG. 1, the array substrate is provided with a first gate line 10, a second gate line 11, a third gate line 12 and a fourth gate line 13 which are horizontally arranged. The first gate line 10 is respectively connected with a first pixel 1 and a third pixel 3; the second gate line 11 is respectively connected with a second pixel 2 and a fourth pixel 4; the third gate line 12 is respectively connected with a fifth pixel 5 and a seventh pixel 7; and the fourth gate line 13 is respectively connected with a sixth pixel 6 and an eighth pixel 8. Moreover, the array substrate is provided with a first data line 14 and a second data line 15 which are vertically arranged. The left side of the first data line 14 is respectively connected with the first pixel 1 and the fifth pixel 5; the right side of the first data line 14 is respectively connected with the second pixel 2 and the sixth pixel 6; the left side of the second data line 15 is respectively connected with the third pixel 3 and the seventh pixel 7; and the right side of the second data line 15 is respectively connected with the fourth pixel 4 and the eighth pixel 8.

Figure 2:
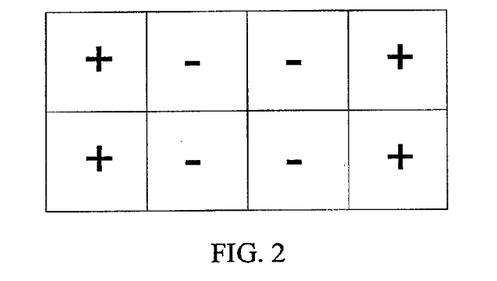
FIG. 2 is a schematic view illustrating polarities of pixels of the array substrate shown in FIG. 1 when a dot inversion drive mode is adopted.

A dot inversion drive mode is widely adopted in the LCD device to avoid the polarization of the liquid crystal molecules. When the LCD device comprising the array substrate shown in FIG. 1 operates in the dot inversion drive mode, the data line inputs a dot inversion signal, and hence a positive electric field is formed for the first time (namely when the gate line in a certain row is scanned) and a negative electric field is formed for the second time (namely when the gate line in a next row is scanned) during the process of forming the electric field. In the case that the array substrate shown in FIG. 1 adopts the dot inversion drive mode, the pixel polarization is schematically illustrated in FIG. 2. When the first gate line provides a drive signal, the first data line provides a positive signal and the second data line provides a negative signal; in this case, the positive electric field is formed at the first pixel and the negative electric field is formed at the third pixel. When the second gate line provides the drive signal, the first data line provides the negative signal and the second data line provides the positive signal; in this case, the negative electric field is formed at the second pixel and the positive electric field is formed at the fourth pixel. When the third gate line provides the drive signal, the first data line provides the positive signal and the second data line provides the negative signal; in this case, the positive electric field is formed at the fifth pixel and the negative electric field is formed at the seventh pixel. When the fourth gate line provides the drive signal, the first data line provides the negative signal and the second data line provides the positive signal; and in this case, the negative electric field is formed at the sixth pixel and the positive electric field is formed at the eighth pixel. It can be seen that adjacent pixels have the same polarity, and hence the phenomenon of coupling or crosstalk between adjacent pixels is caused. The array substrate shown in FIG. 1 does not achieve the requirement of providing opposite polarities between adjacent pixels. Therefore, polarity asymmetry occurs at some portions of the LCD device, and hence coupling, crosstalk and the like are caused between the adjacent pixels so that the image quality of the LCD device is reduced.

SUMMARY

According to some embodiments, an array substrate is provided. The array substrate comprises: a substrate; and a plurality of first pixel groups and a plurality of second pixel groups which are disposed on the substrate and are alternately arranged to form a pixel array. Each first pixel group includes two first pixel units, and each first pixel unit includes a first pixel electrode connected with a common electrode and a second pixel electrode connected with a drain electrode of a drive thin-film transistor (TFT) of the first pixel unit. Each second pixel group includes two second pixel units, and each second pixel unit includes a third pixel electrode connected with a drain electrode of a drive TFT of the second pixel unit and a fourth pixel electrode connected with the common electrode.

In some embodiments, in the first pixel unit, the second pixel electrode is formed above the first pixel electrode; and in the second pixel unit, the fourth pixel electrode is formed above the third pixel electrode.

In some embodiments, the first pixel electrode and the third pixel electrode are plate electrodes or slit electrodes; and the second pixel electrode and the fourth pixel electrode are slit electrodes.

In some embodiments, in the second pixel unit, the third pixel electrode is connected with the drain electrode of the drive TFT of the second pixel unit through a fifth pixel electrode; and the fifth pixel electrode is arranged on a same layer as the fourth pixel electrode.

In some embodiments, the array substrate further comprises: 2n gate lines and n data lines which intersect with each other on the substrate, wherein n is a positive integer.

In some embodiments, each first pixel group is driven by two gate lines and one data line; and each second pixel group is driven by two gate lines and one data line.

In some embodiments, in the first pixel group, the data line is connected with a source electrode of the drive TFT of each first pixel unit; and in the second pixel group, the data line is connected with a source electrode of the drive TFT of each second pixel unit.

In some embodiments, in the first pixel group, the two gate lines are respectively connected with the gate electrode of the drive TFT of the two first pixel units; and in the second pixel group, the two gate lines are respectively connected with the gate electrode of the drive TFT of the two second pixel units In some embodiments, the two first pixel units in the first pixel group are arranged in a direction perpendicular to the data line and the data line configured to control the first pixel group is disposed between the two first pixel units of the first pixel group; and the two second pixel units in each second pixel group are arranged in the direction perpendicular to the data line and the data line configured to control the second pixel group is disposed between the two second pixel units of the second pixel group.

In some embodiments, the gate lines extend in the direction perpendicular to the data lines; the two gate lines for controlling the first pixel group are respectively disposed on both sides of the first pixel group in a direction of the data line; and the two gate lines for controlling the second pixel group are respectively disposed on both sides of the second pixel group in the direction of the data line.

According to some embodiments, a display panel is provided. The display panel comprises the array substrate as described above.

According to some embodiments, a manufacturing method of an array substrate is provided. The method comprises: forming a first pixel electrode and a third pixel electrode on a substrate; forming a first gate electrode and a second gate electrode on the substrate and forming a common electrode on the first pixel electrode and the substrate, wherein the first pixel electrode is in direct contact with the common electrode; at least forming a gate insulation layer on the first gate electrode, the second gate electrode, the first pixel electrode, the third pixel electrode and the common electrode; forming a first active layer, a first source electrode and a first drain electrodes above the first gate electrode through the gate insulation layer, and forming a second active layer, a second source electrode and a second drain electrode above the second gate electrode through the gate insulation layer; forming a passivation insulation layer on the first active layer, the second active layer, the first source electrode, the second source electrode, the first drain electrode, the second drain electrode and the gate insulation layer, wherein a first through hole extended to the first drain electrode is formed on the first drain electrode; a second through hole extended to the third pixel electrode is formed on the third pixel electrode; a third through hole extended to the common electrode is formed on the common electrode; and a fourth through hole extended to the second drain electrode is formed on the second drain electrode; forming a second pixel electrode on the first drain electrode and the passivation insulation layer, wherein the second pixel electrode is connected with the first drain electrode through the first through hole; and forming a fourth pixel electrode on the common electrode and the passivation insulation layer and forming a fifth pixel electrode on the second drain electrode, the third pixel electrode and the passivation insulation layer, wherein the fifth pixel electrode is connected with the third pixel electrode through the second through hole; the fourth pixel electrode is connected with the common electrode through the third through hole; and the fifth pixel electrode is connected with the second drain electrode through the fourth through hole.

In some embodiments, the first gate electrode, the first active layer, the first source electrode, the first drain electrode, the first pixel electrode and the second pixel electrode are configured to form a first pixel unit in a first pixel group; the second gate electrode, the second active layer, the second source electrode, the second drain electrode, the third pixel electrode, the fourth pixel electrode and the fifth pixel electrode are configured to form a second pixel unit in a second pixel group; each first pixel group includes two first pixel units; each second pixel group includes two second pixel units; and a plurality of first pixel groups and a plurality of second pixel groups are alternately arranged to form a pixel array.

In some embodiments, the second pixel electrode is formed above the first pixel electrode; and the fourth pixel electrode is formed above the third pixel electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 3:
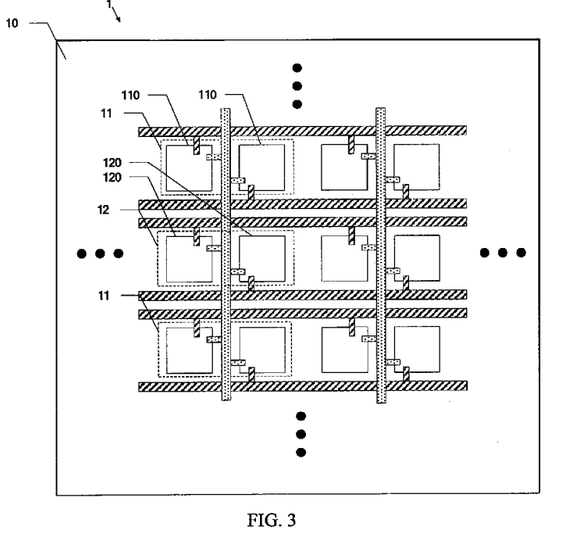
FIG. 3 is a schematic structural view illustrating an array substrate according to some embodiments of the disclosure.

According to some embodiments of the disclosure, an array substrate 1 is provided. As illustrated in FIG. 3, the array substrate 1 comprises: a substrate 10; and a plurality of first pixel groups 11 (as shown by the dotted-line in FIG. 3) and a plurality of second pixel groups 12 (as shown by the dotted-line in FIG. 3). The first pixel groups 11 and the second pixel groups 12 are disposed on the substrate 10 and are alternately arranged to form a pixel array.

Each first pixel group 11 includes two first pixel units 110. Each first pixel unit 110 includes a first pixel electrode connected with a common electrode and a second pixel electrode connected with a drain electrode of a drive TFT of the first pixel unit 110. Each second pixel group 12 includes two second pixel units 120. Each second pixel unit 120 includes a third pixel electrode connected with a drain electrode of a drive TFT of the second pixel unit 120 and a fourth pixel electrode connected with the common electrode.

Figure 4:
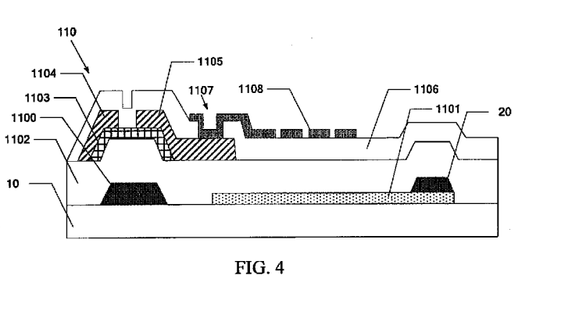
FIG. 4 is a schematic structural view illustrating a first pixel unit according to some embodiments of the disclosure.

In some embodiments, as illustrated in FIG. 4, the first pixel unit 110 includes:

a first gate electrode 1100 and the first pixel electrode 1101 disposed on the substrate 10;

the common electrode 20 disposed on the first pixel electrode 1101, wherein the first pixel electrode 1101 is in direct contact with the common electrode 20;

a gate insulation layer 1102 disposed on the first gate electrode 1100, the first pixel electrode 1101 and the common electrode 20;

a first active layer 1103, a first source electrode 1104 and a first drain electrode 1105 disposed above the first gate electrode 1100;

an insulation layer 1106 disposed on the first active layer 1103, the first source electrode 1104, the first drain electrode 1105 and the gate insulation layer 1102, wherein the insulation layer 1106 is provided with a first through hole 1107 at a position corresponding to the first drain electrode 1105; and a second pixel electrode 1108 disposed on the first drain electrode 1105 and the insulation layer 1106, wherein the second pixel electrode 1108 is connected with the first drain electrode 1105 through the first through hole 1107.

Figure 5:
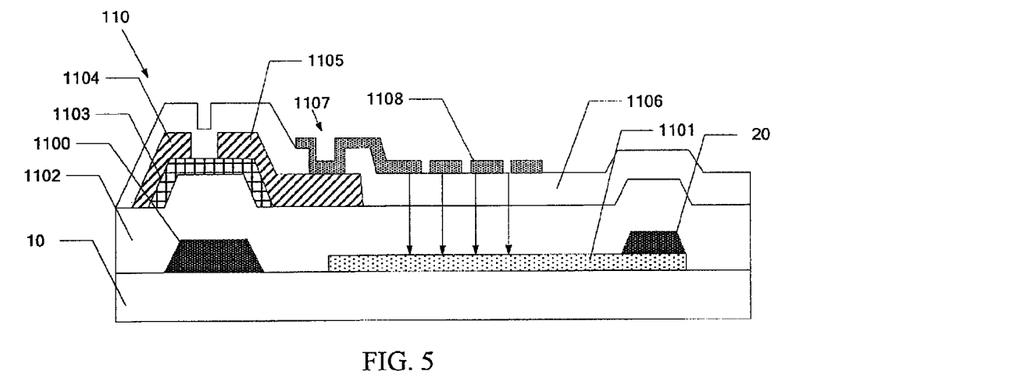
FIG. 5 is a schematic view illustrating an electric field direction of the first pixel unit according to some embodiments of the disclosure.

In the first pixel unit 110, the first pixel electrode 1101 is in direct contact with the common electrode 20, and the second pixel electrode 1108 is connected with the first drain electrode 1105 through the first through hole 1107. Accordingly, as illustrated in FIG. 5, when a positive display signal is received in the operating process of the first pixel unit 110, a downward electric field is formed between the first pixel electrode 1101 together with the common electrode 20 and the second pixel electrode 1108 together with the first drain electrode 1105.

Figure 6:
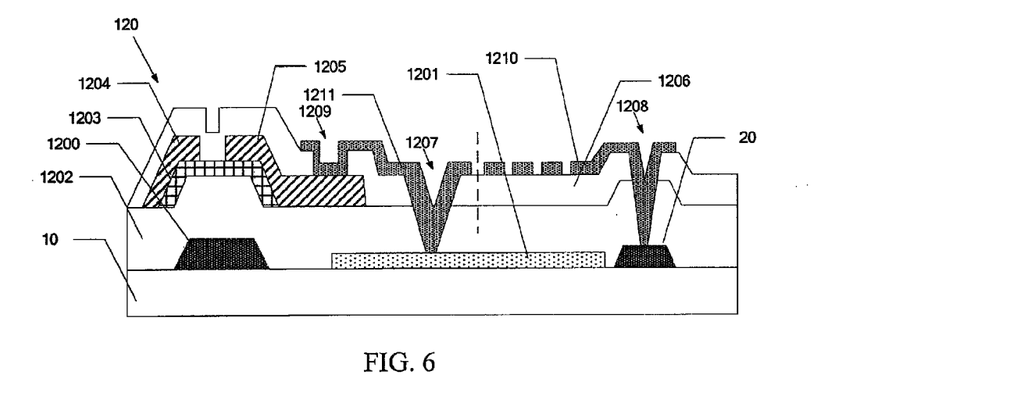
FIG. 6 is a schematic structural view illustrating a second pixel unit according to some embodiments of the disclosure.

In some embodiments, as illustrated in FIG. 6, the second pixel unit 120 includes:

a second gate electrode 1200, a third pixel electrode 1201 and the common electrode 20 disposed on the substrate 10;

a gate insulation layer 1202 disposed on the second gate electrode 1200, the third pixel electrode 1201 and the common electrode 20;

a second active layer 1203, a second source electrode 1204 and a second drain electrode 1205 disposed above the second gate electrode 1200;

an insulation layer 1206 disposed on the second active layer 1203, the second source electrode 1204, the second drain electrode 1205 and the gate insulation layer 1202, wherein the insulation layer 1206 and the gate insulation layer 1202 are provided with a second through hole 1207 at a position corresponding to the third pixel electrode 1201, the insulation layer 1206 and the gate insulation layer 1202 are provided with a third through hole 1208 at a position corresponding to the common electrode 20; and the insulation layer 1206 is provided with a fourth through hole 1209 at a position corresponding to the second drain electrode 1205; and a fourth pixel electrode 1210 (as shown by the right side of a dotted line) disposed on the common electrode 20 and the insulation layer 1206 and a fifth pixel electrode 1211 (as shown by the left side of the dotted line) disposed on the second drain electrode 1205, the third pixel electrode 1201 and the insulation layer 1206, wherein the fourth pixel electrode 1210 is not connected with the fifth pixel electrode 1211; the fifth pixel electrode 1211 is connected with the third pixel electrode 1201 through the second through hole 1207; the fourth pixel electrode 1210 is connected with the common electrode 20 through the third through hole 1208; and the fifth pixel electrode 1211 is connected with the second drain electrode 1205 through the fourth through hole 1209.

Figure 7:
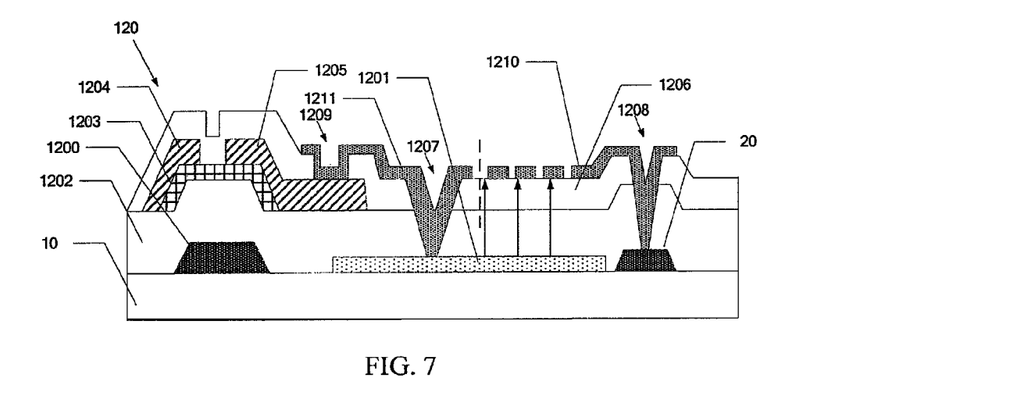
FIG. 7 is a schematic view illustrating an electric field direction of the second pixel unit according to some embodiments of the disclosure.

In the second pixel unit 120, the fifth pixel electrode 1211 is connected with the third pixel electrode 1201 through the second through hole 1207, the fourth pixel electrode 1210 is connected with the common electrode 20 through the third through hole 1208, and the fifth pixel electrode 1211 is connected with the second drain electrode 1205 through the fourth through hole 1209. Accordingly, as illustrated in FIG. 7, when the positive display signal is received in the operating process of the second pixel unit 120, an upward electric field is formed between the fourth pixel electrode 1210 together with the common electrode 20 and the third pixel electrode 1201 together with the second drain electrode 1205.

As seen from FIGS. 4 to 7, in the first pixel unit, the second pixel electrode 1108 is formed above the first pixel electrode 1101; and in the second pixel unit, the fourth pixel electrode 1210 is formed above the third pixel electrode 1201. In some embodiments, in order to apply the electric fields formed between the upper and lower pixel electrodes to a liquid crystal layer, the upper pixel electrodes (the second pixel electrode 1108 and the fourth pixel electrode 1210), for instance, are slit electrodes (e.g., formed by strip electrodes separated with each other by gaps), and the lower pixel electrodes (the first pixel electrode 1101 and the third pixel electrode 1201), for instance, are plate electrodes or slit electrodes.

In some embodiments, the array substrate 1 further comprises: 2n gate lines 13 and n data lines 14, wherein n is a positive integer. The gate lines 13 and the data lines 14 intersect with each other on the substrate 10.

In some embodiments, each first pixel group is driven by two gate lines and one data line. In some embodiments, each second pixel group is driven by two gate lines and one data line.

Figure 8:
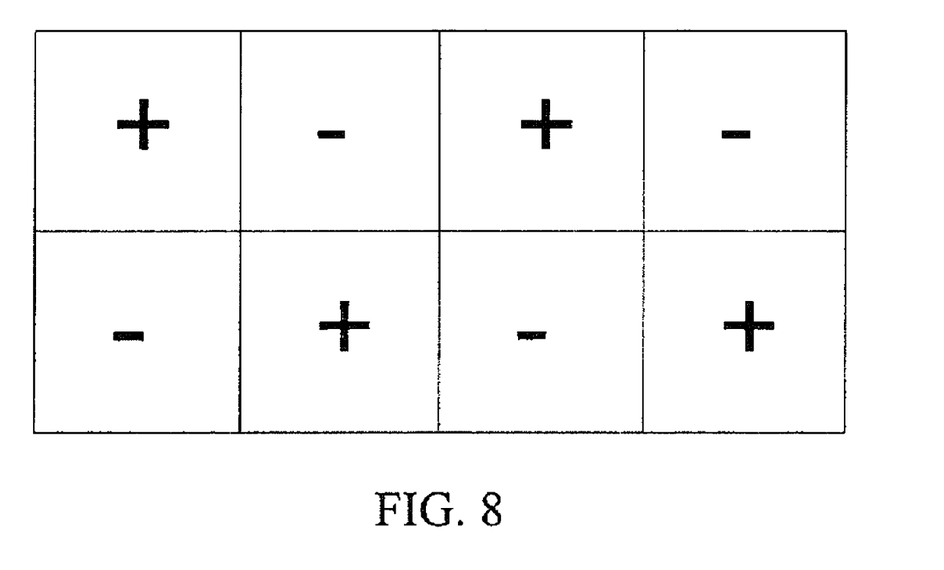
FIG. 8 is a schematic view illustrating polarities of pixel units of the array substrate according to some embodiments of the disclosure when the dot inversion drive mode is adopted.

When the array substrate with the above structure operates in the dot inversion drive mode, the data line inputs a dot inversion signal, and hence a positive electric field is formed for the first time (namely when the gate line in a certain row is scanned) and a negative electric field is formed for the second time (namely when the gate line of a next row is scanned) in the process of forming the electric field. By using the first pixel units 110 and the second pixel units 120 according to some embodiments of the disclosure, the polarities of the pixel units of the arrays substrate are illustrated in FIG. 8, in which the array substrate adopts the dot inversion drive mode. Therefore, at the same time that the number of the data lines is reduced by the DLS technology, the phenomenon of polarity asymmetry is avoided, and hence the possibility of coupling, crosstalk and the like between the adjacent pixel units is reduced and the image quality of the LCD device is improved.

In the first pixel group, the data line 14 is connected with the source electrode 1104 of the drive TFT of each first pixel unit. In the second pixel group, the data line 14 is connected with the source electrode 1204 of the drive TFT of each second pixel unit.

Moreover, in the first pixel group, the two gate lines are respectively connected with the gate electrode of the drive TFT of the two first pixel units. That is to say, one gate line is connected with the gate electrode of the drive ITT of one of the two first pixel units in the first pixel group and the other gate line is connected with the gate electrode of the drive TFT of the other of the two first pixel units in the first pixel group. In the second pixel group, the two gate lines are respectively connected with the gate electrode of the drive TFT of the two second pixel units. That is to say, one gate line is connected with the gate electrode of the drive TFT of one of the two second pixel units in the second pixel group and the other gate line is connected with the gate electrode of the drive TFT of the other of the two second pixel units in the second pixel group.

For instance, as illustrated in FIG. 3, the two first pixel units in each first pixel group are arranged in a direction perpendicular to the data line and the data line configured to control the first pixel group is disposed between the two first pixel units of the first pixel group; the two second pixel units in each second pixel group are arranged in the direction perpendicular to the data line and the data line configured to control the second pixel group is disposed between the two second pixel units of the second pixel group.

For instance, as illustrated in FIG. 3, the gate line extends in the direction perpendicular to the data line, the two gate lines for controlling each first pixel group are respectively disposed on both sides of the first pixel group in the direction of the data line, and the two gate lines for controlling each second pixel group are respectively disposed on both sides of the second pixel group in the direction of the data line.

According to some embodiments of the disclosure, the structure of the first pixel unit 110 and the structure of the second pixel unit 120 are different in that: when the first pixel unit 110 operates, the downward electric field is formed between the first pixel electrode 1101 together with the common electrode 20 and the second pixel electrode 1108 together with the first drain electrode 1105; and when the second pixel unit 120 operates, the upward electric field is formed between the fourth pixel electrode 1210 together with the common electrode 20 and the third pixel electrode 1201 together with the second drain electrode 1205. In this way, in the case that the array substrate adopts the dot inversion drive mode, the polarities of the pixel units of the arrays substrate as illustrated in FIG. 8 is obtained. Therefore, in the case that the number of the data lines is reduced by the DLS technology, the phenomenon of polarity asymmetry is avoided, and hence the possibility of coupling, crosstalk and the like between the pixel units is adjacent reduced and the image quality of the LCD device is improved.

According to some embodiments of the disclosure, when the first pixel unit 110 operates, the upward electric field is formed between the first pixel electrode 1101 together with the common electrode 20 and the second pixel electrode 1108 together with the first drain electrode 1105; and when the second pixel unit 120 operates, the downward electric field is formed between the fourth pixel electrode 1210 together with the common electrode 20 and the third pixel electrode 1201 together with the second drain electrode 1205. The embodiments of the disclosure are not limited thereto.

According to some embodiments of the disclosure, an array substrate is provided. The array substrate comprises a substrate, and a plurality of first pixel groups and a plurality of second pixel groups. The first pixel groups and the second pixel groups are disposed on the substrate and are alternately arranged to form a pixel array. Each first pixel group includes two first pixel units. Each first pixel unit includes a first pixel electrode connected with a common electrode and a second pixel electrode connected with a drain electrode of a drive TFT of the first pixel unit. Each second pixel group includes two second pixel units. Each second pixel unit includes a third pixel electrode connected with a drain electrode of a drive TFT of the second pixel unit and a fourth pixel electrode connected with the common electrode. In the array substrate, at the same time that the number of the data lines is reduced by the DLS technology, the phenomenon of polarity asymmetry is avoided, and hence the possibility of coupling, crosstalk and the like between the adjacent pixel units is reduced and the image quality of the LCD device is improved.

According to some embodiments of the disclosure, a manufacturing method of an array substrate is provided. The method comprises:

S101: forming 2n gate lines and n data lines on a substrate, wherein n is a positive integer.

Each data line is connected with a first source electrode and a second source electrode.

By using the DLS technology, 2n gate lines and n data lines intersect with each other on the substrate.

S102: forming a plurality of first pixel groups and a plurality of second pixel groups on the substrate, wherein the first pixel groups and the second pixel groups are alternately arranged to form a pixel array.

Each first pixel group includes two first pixel units. Each first pixel unit includes a first pixel electrode connected with a common electrode and a second pixel electrode connected with a drain electrode of a drive TFT of the first pixel unit. Each second pixel group includes two second pixel units. Each second pixel unit includes a third pixel electrode connected with a drain electrode of a drive TFT of the second pixel unit and a fourth pixel electrode connected with the common electrode.

For instance, the process of forming the plurality of first pixel groups and the plurality of second pixel groups on the substrate includes:

S201: forming the first pixel electrode and the third pixel electrode on the substrate.

S202: forming a first gate electrode and a second gate electrode on the substrate, and forming the common electrode on the first pixel electrode and the substrate, wherein the first pixel electrodes is in direct contact with the common electrode.

The first gate electrode is connected with the corresponding gate line and the second gate electrode is connected with the corresponding gate line.

According to some embodiments: during forming the first pixel unit, as the gate electrode and the common electrode are made of the same material, the gate electrode and the common electrode are manufactured by a same patterning process. Therefore, during forming the first pixel unit, the first pixel electrode is formed on the substrate at first, and then the first gate electrode and the common electrode disposed on the first pixel electrode are formed by the same patterning process. The first pixel electrode is in direct contact with the common electrode.

S203: forming a gate insulation layer at least on the first gate electrode, the second gate electrode, the first pixel electrode, the third pixel electrode and the common electrode.

S204: forming a first active layer, the first source electrode and the first drain electrode above the first gate electrode through the gate insulation layer, and forming a second active layer, the second source electrode and the second drain electrode above the second gate electrodes through the gate insulation layer.

S205: forming a passivation insulation layer on the first source layer, the second source layer, the first source electrode, the second source electrode, the first drain electrode, the second drain electrode and the gate insulation layer, wherein a first through hole extended to the first drain electrode is formed on the first drain electrode; a second through hole extended to the third pixel electrode is formed on the third pixel electrode; a third through hole extended to the common electrode is formed on the common electrode; and a fourth through hole extended to the second drain electrode is formed on the second drain electrode.

S206: forming a second pixel electrode on the first drain electrode and the passivation insulation layer, and forming a fourth pixel electrode on the common electrode and the passivation insulation layer and forming a fifth pixel electrode on the second drain electrode, the third pixel electrode and the passivation insulation layer. The second pixel electrode is connected with the first drain electrode through the first through hole. The fifth pixel electrode is connected with the third pixel electrode through the second through hole; the fourth pixel electrode is connected with the common electrode through the third through hole; and the fifth pixel electrode is connected with the second drain electrode through the fourth through hole.

In the first pixel unit, the first pixel electrode is in direct contact with the common electrode, and the second pixel electrode is connected with the first drain electrode through the first through hole. Accordingly, as illustrated in FIG. 5, when the first pixel unit operates, the downward electric field is formed between the first pixel electrode together with the common electrode and the second pixel electrode together with the first drain electrode. In the second pixel unit, the fifth pixel electrode is connected with the third pixel electrode through the second through hole, the fourth pixel electrode is connected with the common electrode through the third through hole, and the fifth pixel electrode is connected with the second drain electrode through the fourth through hole. Accordingly, as illustrated in FIG. 7, when the second pixel unit operates, the upward electric field is formed between the fourth pixel electrode together with the common electrode and the third pixel electrode together with the second drain electrode.

When the array substrate manufactured by the above method operates in the dot inversion drive mode, the data line inputs the dot inversion signal, and hence the positive electric field is formed for the first time and the negative electric field is formed for the second time in the process of forming the electric field. By using the first pixel units and the second pixel units according to some embodiments of the disclosure, the polarities of the pixel units of the arrays substrate are illustrated in FIG. 8, in which the array substrate adopts the dot inversion drive mode. Therefore, at the same time that the number of the data lines is reduced by the DLS technology, the phenomenon of polarity asymmetry is avoided, and hence the possibility of coupling, crosstalk and the like between the adjacent pixel units is reduced and the image quality of the LCD device is improved.

According to some embodiments of the disclosure, the structure of the first pixel unit and the structure of the second pixel unit are different in that: when the first pixel unit operates, the downward electric field is formed between the first pixel electrode together with the common electrode and the second pixel electrode together with the first drain electrode; and when the second pixel unit operates, the upward electric field is formed between the fourth pixel electrode together with the common electrode and the third pixel electrode together with the second drain electrode. In this way, in the case that the array substrate adopts the dot inversion drive mode, the polarities of the pixel units of the arrays substrate as illustrated in FIG. 8 is obtained. Therefore, in the case that the number of the data lines is reduced by the DLS technology, the phenomenon of polarity asymmetry is avoided, and hence the possibility of coupling, crosstalk and the like between the pixel units is adjacent reduced and the image quality of the LCD device is improved.

According to some embodiments of the disclosure, when the first pixel unit operates, the upward electric field is formed between the first pixel electrode together with the common electrode and the second pixel electrode together with the first drain electrode; and when the second pixel unit operates, the downward electric field is formed between the fourth pixel electrode together with the common electrode and the third pixel electrode together with the second drain electrode. The embodiments of the disclosure are not limited thereto.

According to some embodiments of the invention, a manufacturing method of an array substrate is provided. The method comprises: forming a first pixel electrode and a third pixel electrode on a substrate, forming a first gate electrode and a second gate electrode on the substrate and forming a common electrode on the first pixel electrode and the substrate, wherein the first pixel electrode is in direct contact with the common electrode; at least forming a gate insulation layer on the first gate electrode, the second gate electrode, the first pixel electrode, the third pixel electrode and the common electrode; forming a first active layer, a first source electrode and a first drain electrodes above the first gate electrode through the gate insulation layer, and forming a second active layer, a second source electrode and a second drain electrode above the second gate electrode through the gate insulation layer; forming a passivation insulation layer on the first active layer, the second active layer, the first source electrode, the second source electrode, the first drain electrode, the second drain electrode and the gate insulation layer, wherein a first through hole extended to the first drain electrode is formed on the first drain electrode; a second through hole extended to the third pixel electrode is formed on the third pixel electrode; a third through hole extended to the common electrode is formed on the common electrode; and a fourth through hole extended to the second drain electrode is formed on the second drain electrode; forming a second pixel electrode on the first drain electrode and the passivation insulation layer, wherein the second pixel electrode is connected with the first drain electrode through the first through hole; and forming a fourth pixel electrode and a fifth pixel electrode on the second drain electrode and the passivation insulation layer, wherein the fifth pixel electrode is connected with the third pixel electrode through the second through hole; the fourth pixel electrode is connected with the common electrode through the third through hole; and the fifth pixel electrode is connected with the second drain electrode through the fourth through hole. In the array substrate, at the same time that the number of the data lines is reduced by the DLS technology, the phenomenon of polarity asymmetry is avoided, and hence the possibility of coupling, crosstalk and the like between the adjacent pixel units is reduced and the image quality of the LCD device is improved.

According to some embodiments, the manufacturing method as described above is used for manufacturing the foregoing array substrate. Therefore, the above structure description of the array substrate is also applicable to the manufacturing method. For instance, the first gate electrode, the first active layer, the first source electrode, the first drain electrode, the first pixel electrode and the second pixel electrode are configured to form the pixel unit in the first pixel group; the second gate electrode, the second active layer, the second source electrode, the second drain electrode, the third pixel electrode, the fourth pixel electrode and the fifth pixel electrode are configured to form the pixel unit in the second pixel group; each first pixel group includes two first pixel units; each second pixel group includes two second pixel units; and the plurality of first pixel groups and the plurality of second pixel groups are alternately arranged to form the pixel array. For instance, in the process of manufacturing the pixel electrodes, the second pixel electrode is formed above the first pixel electrode, and the fourth pixel electrode is formed above the third pixel electrode.

According to some embodiments of the disclosure, a display panel is provided. The display panel comprises the array substrate as described above.

The display panel according to some embodiments of the disclosure is an LCD device. According to some embodiments, the LCD device is any product or component with display function such as an LCD, an LCD TV, a digital photo frame, a mobile phone, a tablet PC and the like.

The foregoing embodiments merely are exemplary embodiments of the invention, and not intended to define the scope of the invention, and the scope of the invention is determined by the appended claims.

What is claimed is:

1. An array substrate, comprising:
a substrate; and
a plurality of first pixel groups and a plurality of second pixel groups which are disposed on the substrate and are alternately arranged to form a pixel array,
wherein each first pixel group includes two first pixel units, and each first pixel unit includes a first pixel electrode electrically connected with a common electrode and a second pixel electrode connected with a drain electrode of a drive thin-film transistor (TFT) of the first pixel unit;
each second pixel group includes two second pixel units, and each second pixel unit includes a third pixel electrode connected with a drain electrode of a drive TFT of the second pixel unit and a fourth pixel electrode electrically connected with the same common electrode;
wherein the first pixel electrode and the third pixel electrode are plate electrodes or slit electrodes; and
the second pixel electrode and the fourth pixel electrode are slit electrodes.

2. The array substrate according to claim 1, wherein
in the first pixel unit, the second pixel electrode is formed above the first pixel electrode; and
in the second pixel unit, the fourth pixel electrode is formed above the third pixel electrode.

3. The array substrate according to claim 1, wherein
in the second pixel unit, the third pixel electrode is connected with the drain electrode of the drive TFT of the second pixel unit through a fifth pixel electrode; and
the fifth pixel electrode is arranged on a same layer as the fourth pixel electrode.

4. The array substrate according to claim 1, further comprising:
2n gate lines and n data lines which intersect with each other on the substrate, wherein n is a positive integer.

5. The array substrate according to claim 4, wherein
each first pixel group is driven by two gate lines and one data line; and
each second pixel group is driven by two gate lines and one data line.

6. The array substrate according to claim 5, wherein
in the first pixel group, the data line is connected with a source electrode of the drive TFT of each first pixel unit; and
in the second pixel group, the data line is connected with a source electrode of the drive TFT of each second pixel unit.

7. The array substrate according to claim 6, wherein
in the first pixel group, the two gate lines are respectively connected with the gate electrode of the drive TFT of the two first pixel units; and
in the second pixel group, the two gate lines are respectively connected with the gate electrode of the drive TFT of the two second pixel units.

8. The array substrate according to claim 5, wherein
the two first pixel units in the first pixel group are arranged in a direction perpendicular to the data line and the data line configured to control the first pixel group is disposed between the two first pixel units of the first pixel group; and
the two second pixel units in each second pixel group are arranged in the direction perpendicular to the data line and the data line configured to control the second pixel group is disposed between the two second pixel units of the second pixel group.

9. The array substrate according to claim 8, wherein
the gate lines extend in the direction perpendicular to the data lines;
the two gate lines for controlling the first pixel group are respectively disposed on both sides of the first pixel group in a direction of the data line; and
the two gate lines for controlling the second pixel group are respectively disposed on both sides of the second pixel group in the direction of the data line.

10. A display panel, comprising an array substrate according to claim 1.

11. A manufacturing method of an array substrate, comprising:
forming a first pixel electrode and a third pixel electrode on a substrate;
forming a first gate electrode and a second gate electrode on the substrate and forming a common electrode on the first pixel electrode and the substrate, wherein the first pixel electrode is in direct contact with the common electrode;
at least forming a gate insulation layer on the first gate electrode, the second gate electrode, the first pixel electrode, the third pixel electrode and the common electrode;
forming a first active layer, a first source electrode and a first drain electrodes above the first gate electrode through the gate insulation layer, and forming a second active layer, a second source electrode and a second drain electrode above the second gate electrode through the gate insulation layer;
forming a passivation insulation layer on the first active layer, the second active layer, the first source electrode, the second source electrode, the first drain electrode, the second drain electrode and the gate insulation layer, wherein a first through hole extended to the first drain electrode is formed on the first drain electrode; a second through hole extended to the third pixel electrode is formed on the third pixel electrode;
a third through hole extended to the common electrode is formed on the common electrode; and
a fourth through hole extended to the second drain electrode is formed on the second drain electrode;
forming a second pixel electrode on the first drain electrode and the passivation insulation layer, wherein the second pixel electrode is connected with the first drain electrode through the first through hole; and forming a fourth pixel electrode on the common electrode and the passivation insulation layer and forming a fifth pixel electrode on the second drain electrode, the third pixel electrode and the passivation insulation layer, wherein the fifth pixel electrode is connected with the third pixel electrode through the second through hole;

the fourth pixel electrode is connected with the common electrode through the third through hole; and the fifth pixel electrode is connected with the second drain electrode through the fourth through hole.

12. The method according to claim 11, wherein the second pixel electrode is formed above the first pixel electrode; and the fourth pixel electrode is formed above the third pixel electrode.

13. The array substrate according to claim 2, wherein in the second pixel unit, the third pixel electrode is connected with the drain electrode of the drive TFT of the second pixel unit through a fifth pixel electrode; and the fifth pixel electrode is arranged on a same layer as the fourth pixel electrode.

14. The array substrate according to claim 1, wherein in the second pixel unit, the third pixel electrode is connected with the drain electrode of the drive TFT of the second pixel unit through a fifth pixel electrode; and the fifth pixel electrode is arranged on a same layer as the fourth pixel electrode.

\* \* \* \* \*